United States Patent
Mukasa et al.

(10) Patent No.: US 12,233,493 B2
(45) Date of Patent: Feb. 25, 2025

(54) HEAT TRANSFER SHEET, METHOD FOR PRODUCING HEAT TRANSFER SHEET, HEAT TRANSFER SHEET PACKAGE, AND METHOD FOR PRODUCING HEAT TRANSFER SHEET PACKAGE

(71) Applicant: DEXERIALS CORPORATION, Shimotsuke (JP)

(72) Inventors: Keisuke Mukasa, Shimotsuke (JP); Yusuke Kubo, Shimotsuke (JP); Keisuke Aramaki, Shimotsuke (JP)

(73) Assignee: Dexerials Corporation, Shimotsuke (JP)

( * ) Notice: Subject to any disclaimer, the term of this patent is extended or adjusted under 35 U.S.C. 154(b) by 0 days.

(21) Appl. No.: 18/276,497

(22) PCT Filed: Feb. 3, 2022

(86) PCT No.: PCT/JP2022/004193
§ 371 (c)(1),
(2) Date: Aug. 9, 2023

(87) PCT Pub. No.: WO2022/176628
PCT Pub. Date: Aug. 25, 2022

(65) Prior Publication Data
US 2024/0116146 A1 Apr. 11, 2024

(30) Foreign Application Priority Data
Feb. 17, 2021 (JP) .................................. 2021-023426

(51) Int. Cl.
*B23P 15/26* (2006.01)
*B29C 43/00* (2006.01)
(Continued)

(52) U.S. Cl.
CPC ............ *B23P 15/26* (2013.01); *B29C 43/003* (2013.01); *B29C 43/56* (2013.01); *F28F 3/00* (2013.01);
(Continued)

(58) Field of Classification Search
CPC ....... B23P 15/26; B29C 43/003; B29C 43/56; B29C 2043/561; B29C 43/34; F28F 3/00;
(Continued)

(56) References Cited

U.S. PATENT DOCUMENTS
2016/0150680 A1 5/2016 Aramaki et al.

FOREIGN PATENT DOCUMENTS
JP 5752299 B2 7/2015

OTHER PUBLICATIONS
Written Opinion of the International Searching Authority issued May 10, 2022 in PCT/JP2022/004193 (with English translation), 6 pages.
(Continued)

*Primary Examiner* — Lee A Holly
(74) *Attorney, Agent, or Firm* — Element IP, PLC

(57) ABSTRACT

A method for producing a heat transfer sheet, includes: (A1) forming a mixture including at least one of a carbon fiber and a boron nitride flake, an inorganic filler, and a binder resin into a molded body in which the at least one of the carbon fiber and the boron nitride flake is oriented in a thickness direction of the molded body; (B1) slicing the molded body into a sheet shape to obtain a molded sheet; (C1) pressing the molded sheet; and (D1), after the pressing, inserting the molded sheet between films and performing a vacuum packing of the molded sheet with the films such that an uncured component of the binder resin present inside the molded sheet is exuded to a surface of the molded sheet, which is the heat transfer sheet.

4 Claims, 4 Drawing Sheets

(51) Int. Cl.
  *B29C 43/56* (2006.01)
  *F28F 3/00* (2006.01)
(52) U.S. Cl.
  CPC ..... *B29C 2043/561* (2013.01); *F28F 2255/06* (2013.01); *F28F 2255/14* (2013.01)
(58) Field of Classification Search
  CPC ... F28F 2255/06; F28F 2255/14; H01L 23/36; H05K 7/20
  See application file for complete search history.

(56) References Cited

OTHER PUBLICATIONS

International Search Report issued May 10, 2022 in PCT/JP2022/004193 (with English translation), 4 pages.

HEAT TRANSFER SHEET, METHOD FOR PRODUCING HEAT TRANSFER SHEET, HEAT TRANSFER SHEET PACKAGE, AND METHOD FOR PRODUCING HEAT TRANSFER SHEET PACKAGE

TECHNICAL FIELD

The present art relates to a method for producing a heat transfer sheet, a heat transfer sheet package, and a method for producing a heat transfer sheet package. The present application claims priority based on Japanese Patent Application No. 2021-023426 filed in Japan on Feb. 17, 2021, which is hereby incorporated by reference into the present application.

BACKGROUND TECHNOLOGY

Conventionally, semiconductor devices installed in various electrical devices, such as personal computers and other equipment generate heat when driven, and if the heat generated accumulates, it may adversely affect the drive of the semiconductor device and peripheral equipment, so various cooling methods are used.

Known methods for cooling equipment containing semiconductor devices include, for example, attaching a fan to the equipment to cool the air inside the equipment housing, attaching a heat sink, such as heat-radiating fins or heat sink plates, to the semiconductor device, and immersing the device in a fluorine-based inert liquid. When a heat sink is attached to a semiconductor device for cooling, a heat transfer sheet is provided between the semiconductor device and the heat sink to efficiently dissipate the heat of the semiconductor device.

One example of a heat transfer sheet is a heat transfer sheet having a sheet body wherein a thermally conductive resin composition containing a thermally conductive filler is cured in a binder resin, and a surface is coated by an uncured component of the binder resin exuded from the sheet body (for example, see, Patent Document 1).

It is thought that tackiness of the heat transfer sheet develops when the uncured component of the binder resin bleeds (exudes) onto an interface when the surface of the sheet body contacts a packaging material, such as a film. However, when the amount of uncured component of the binder resin that bleeds is unstable, there is a risk of the tackiness becoming stronger or weaker within a face of the heat transfer sheet. When the tackiness becomes stronger or weaker within the face of the heat transfer sheet, the heat transfer sheet is likely to shift position or peel off when mounted due to the tackiness of a portion thereof becoming partially weaker. Therefore, a process of stabilizing a tack force within the face of the heat transfer sheet to impart tackiness so that the heat transfer sheet does not fall off even when stuck to an adherend and inverted is desirable.

CITATION LIST

Patent Documents

Patent Document 1: Japanese Patent No. 5752299

SUMMARY OF INVENTION

Problem to be Solved by Invention

The present art was proposed in view of these existing circumstances, and provides a method for producing a heat transfer sheet, a heat transfer sheet package, and a method for producing a heat transfer sheet package capable of improving adhesion to an adherend.

Means to Solve the Problem

A method for producing a heat transfer sheet according to the present art, the method including: a process of forming a mixture containing at least one of a carbon fiber and a boron nitride flake, an inorganic filler, and a binder resin into a molded body, and orienting at least one of the carbon fiber and the boron nitride flake in a thickness direction of the molded body; a process of slicing the molded body into a sheet shape to obtain a molded sheet; a process of pressing a sliced face of the molded sheet; and a process of inserting the pressed molded sheet between films and vacuum packing it to cause an uncured component of the binder resin present inside the pressed molded sheet to be exuded to the pressed molded sheet surface.

A method for producing a heat transfer sheet package according to the present art, the method including: a process of forming a mixture containing at least one of a carbon fiber and a boron nitride flake, an inorganic filler, and a binder resin into a molded body, and orienting at least one of the carbon fiber and the boron nitride flake in a thickness direction of the molded body; a process of slicing the molded body into a sheet shape to obtain a molded sheet; a process of pressing a sliced face of the molded sheet; and a process of inserting the pressed molded sheet between thermoplastic resin films and vacuum packing it.

In the present art, a heat transfer sheet includes at least one of a carbon fiber and a boron nitride flake, an inorganic filler, and a binder resin, and at least one of the carbon fiber and the boron nitride flake are oriented in a thickness direction of the heat transfer sheet; wherein a tack force satisfies condition 1 below when removed from a sealed state created by holding a reduced pressure state of 150 to 300 torr for one minute or more.

Condition 1: The tack force of the heat transfer sheet surface is 100 gf or more when a probe having a diameter of 5.1 mm presses in the heat transfer sheet at a force of 200 gf at 2 mm/sec and pulls it off at 10 mm/sec.

Effect of the Invention

Adhesion of the heat transfer sheet to an adherend can be improved according to the present art.

DESCRIPTION OF THE EMBODIMENTS

<Method for producing a heat transfer sheet>

A method for producing a heat transfer sheet according to the present art, the method including: a process of forming a mixture containing at least one of a carbon fiber and a boron nitride flake, an inorganic filler, and a binder resin into a molded body, and orienting at least one of the carbon fiber and the boron nitride flake in a thickness direction of the molded body (hereinafter referred to as process A1); a process of slicing the molded body into a sheet shape to obtain a molded sheet (hereinafter referred to as process B1); a process of pressing a sliced face of the molded sheet (hereinafter referred to as process C1); and a process of inserting the pressed molded sheet between films and vacuum packing it to cause an uncured component of the binder resin present inside the pressed molded sheet to be exuded to the pressed molded sheet surface (hereinafter referred to as process D1).

Figure 1:
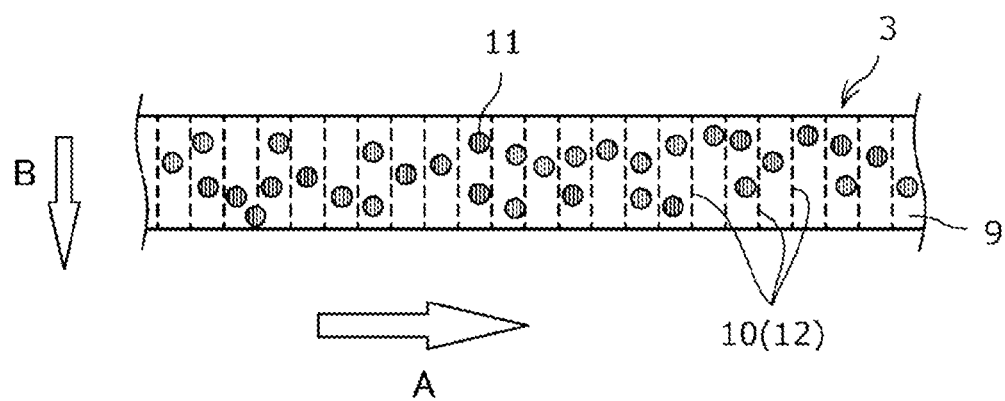
FIG. 1 is a cross-sectional view illustrating one example of a heat transfer sheet.

FIG. 1 is a cross-sectional view illustrating one example of a heat transfer sheet. According to the present production method, by inserting a pressed molded sheet between films and vacuum packing it, the mechanism by which an oil component (for example, an uncured component of a binder resin 9 of a heat transfer sheet 3) present inside the heat transfer sheet 3 bleeds to an interface with the film is promoted by a reduced pressure state, and a tackiness of the heat transfer sheet 3 may be developed further. Therefore, ease of handling of the heat transfer sheet 3 obtained by this production method may be improved during use and, for example, adhesion to an adherend may be improved.

[Process A1]

In the process A1, a mixture containing at least one of the carbon fiber 10 and the boron nitride flake 12, an inorganic filler 11, and the binder resin 9 is formed into a molded body, and the carbon fiber 10 is oriented in a thickness direction of the molded body. For example, in the process A1, a thermally conductive resin composition containing at least one of the carbon fiber 10 and the boron nitride flake 12, the inorganic filler 11, and the binder resin 9 is first prepared. The thermally conductive resin composition may be uniformly mixed together with various additives or volatile solvents by a known method.

Next, in the process A1, a molded block is formed from the thermally conductive resin composition. An extrusion molding method, a die molding method, or the like is given as an example of the method for forming the molded block. The extrusion molding and die molding methods are not particularly limited, and may be adopted as appropriate from among various known extrusion molding and die molding methods depending on the viscosity of the thermally conductive resin composition, the properties required for the heat transfer sheet, or the like.

For example, when the thermally conductive resin composition is pushed out from a die in the extrusion molding method, or when the thermally conductive resin composition is pressed into a die in the die molding method, the binder resin 9 flows and at least one of the carbon fiber 10 and the boron nitride flake 12 are oriented along the flow direction thereof.

A size and shape of the molded block may be determined according to a required size of the heat transfer sheet. An example includes a cuboid having a cross section size of 0.5 to 15 cm in length and 0.5 to 15 cm in width. The length of the cuboid may be determined as needed. The extrusion molding method facilitates the formation of a columnar molded block, composed of a cured product of the thermally conductive resin composition wherein a major axis of the carbon fiber 10 and/or a major axis of the boron nitride flake 12 are oriented in an extrusion direction.

It is preferable that the obtained molded body is subjected to thermosetting. The curing temperature for thermosetting may be selected as appropriate according to the purpose; for example, when the binder resin 9 is a silicone resin, it may be in a range of 60° C. to 120° C. The curing time for thermosetting may be in a range of 30 minutes to 10 hours, for example.

Next, the carbon fiber 10, the boron nitride flake 12, the inorganic filler 11, and the binder resin 9 used in the process A1 will be described.

<Carbon fiber>

The carbon fiber 10 may be, for example, a pitch-based carbon fiber, PAN-based carbon fiber, graphitized PBO fiber, or a carbon fiber synthesized by an arc discharge method, laser evaporation method, CVD (chemical vapor deposition) method, CCVD (catalytic chemical vapor deposition) method, or the like. Among these, a pitch-based carbon fiber is preferred from the viewpoint of thermal conductivity.

An average fiber length (average major axis length) of the carbon fiber 10 may be, for example, 50 to 250 μm, or even 75 to 200 μm or 90 to 170 μm. Furthermore, an average fiber diameter (average minor axis length) of the carbon fiber 10 may be selected as appropriate according to the purpose; for example, it may be 4 to 20 μm or even 5 to 14 μm. An aspect ratio (average major axis length/average minor axis length) of the carbon fiber 10 may be selected as appropriate according to the purpose; for example, it may be 9 to 30. The average major axis length and average minor axis length of the carbon fiber 10 may be measured, for example, by a microscope or scanning electron microscope (SEM).

A surface of the carbon fiber 10 may be coated by an insulating film. Thus, an insulation-coated carbon fiber may be used as the carbon fiber 10. The insulation-coated carbon fiber has the carbon fiber 10 and an insulating film on at least one portion of the surface of the carbon fiber 10, and may contain other components as required.

The insulating film is composed of a material having an electrical insulating property, and is formed of, for example, a silicon oxide or a cured product of a polymerizable material. The polymerizable material is, for example, a radical polymerizable material, and examples include organic compounds having polymerizability, resins having polymerizability, and the like. A radical polymerizable material may be selected as appropriate according to the purpose, provided that the material utilizes energy for radical polymerization, and a compound having a radical polymerizable double bond may be given as an example. A vinyl group, an acryloyl group, a methacryloyl group, or the like may be given as examples of the radical polymerizable double bond. Two or more radical polymerizable double bonds in a compound having a radical polymerizable double bond is preferred from the viewpoint of heat resistance and strength including solvent resistance. Examples of compounds having two or more radical polymerizable double bonds include divinylbenzene (DVB) and compounds having two or more (meth)acryloyl groups. One type of radical polymerizable material may be used alone or two or more types may be used in combination. A molecular weight of the radical polymerizable material may be selected as appropriate according to the purpose, and may be, for example, in a range of 50 to 500. When the insulating film is formed by a cured product of a polymerizable material, a content of the constituent units derived from the polymerizable material in the insulating film may be, for example, 50 mass % or more, and may also be 90 mass % or more.

An average thickness of the insulating film may be selected as appropriate according to the purpose, and from the viewpoint of achieving high insulation, it may be 50 nm or more, or even 100 nm or more or 200 nm or more. An upper limit of the average thickness of the insulating film may be, for example, 1,000 nm or less or even 500 nm or less. The average thickness of the insulating film may be established, for example, by transmission electron microscopy (TEM) observation.

Examples of methods for coating the carbon fiber 10 using an insulating film include a sol-gel method, a liquid phase deposition method, a polysiloxane method, a method for forming an insulating film composed of a cured product of polymerizable material on at least one portion of the surface of the carbon fiber taught in JP 2018-98515 A, or the like.

From the viewpoint of thermal conductivity of the heat transfer sheet 3, a content of the carbon fiber 10 in the thermally conductive resin composition may be, for example, 15 mass % or more, may be 18 mass % or more, may be 20 mass % or more, may be 21 mass % or more, or may be or 22 mass % or more. Furthermore, from the viewpoint of suppressing the viscosity of the heat transfer sheet 3 from becoming too high, the content of carbon fiber 10 in the thermally conductive resin composition may be, for example, 30 mass % or less, may be 28 mass % or less, may be 25 mass % or less, may be 24 mass % or less, or may be 23 mass % or less. One type of the carbon fiber 10 may be used alone or two or more types may be used in combination. When two or more types of the carbon fiber 10 are used in combination, it is preferable that the content thereof meets the aforementioned content.

<Boron nitride flake>

Figure 2:
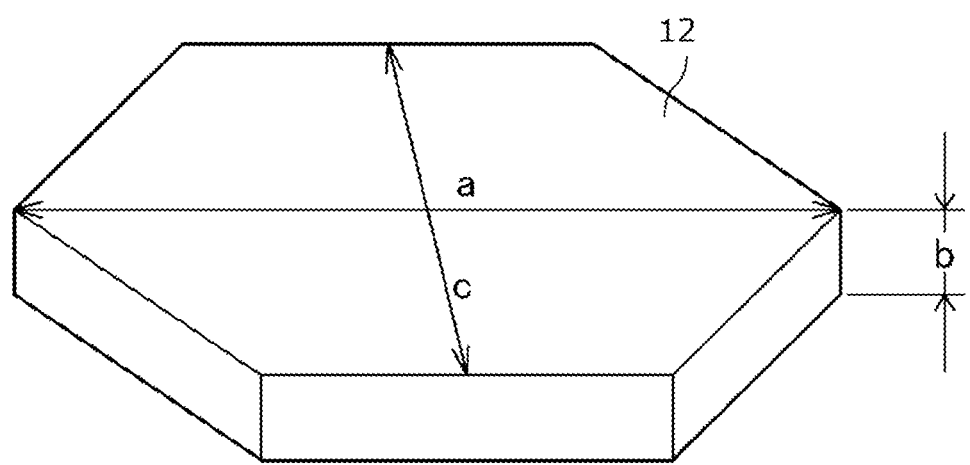
FIG. 2 is a perspective view schematically illustrating a boron nitride flake having a hexagonal crystal shape.

The boron nitride flake 12 is boron nitride having a major axis, a minor axis, and a thickness, and has a high aspect ratio (major axis/thickness) and isotropic thermal conductivity in a face direction including the major axis. The minor axis is a length of a shortest portion of the boron nitride flake 12 on a face including the major axis of the boron nitride flake 12 and in a direction intersecting the major axis at a substantial center portion of a particle of boron nitride flake 12. Thickness refers to a value that is an average of measurements taken at ten points of the thickness of the face including the major axis of the boron nitride flake 12. FIG. 2 is a perspective view schematically illustrating the boron nitride flake 12 having a hexagonal crystal shape. In FIG. 2, a represents the major axis of the boron nitride flake 12, b represents the thickness of the boron nitride flake 12, and c represents the minor axis of the boron nitride flake 12. From the viewpoint of thermal conductivity of the heat transfer sheet 3, it is preferable to use boron nitride flake 12 having a hexagonal crystal shape as the boron nitride flake 12, as illustrated in FIG. 2.

An average particle diameter (D50) of the boron nitride flake 12 is not particularly limited and may be selected as appropriate according to the purpose. For example, the average particle diameter of a heat transfer material 5 having shape anisotropy may be 10 μm or more, or even 20 μm or more, 30 μm or more, 35 μm or more, or 40 μm or more. Furthermore, an upper limit of the average particle diameter of the boron nitride flake 12 may be 150 μm or less, or even 100 μm or less, 90 μm or less, 80 μm or less, 70 μm or less, 50 μm or less, or 45 μm or less. From the viewpoint of thermal conductivity of the heat transfer sheet 3, the average particle diameter of the boron nitride flake 12 may be 20 to 100 μm, or may be 30 to 60 μm. A volume average particle diameter of the boron nitride flake 12 refers to a particle diameter—when a cumulative curve of the value of the particle diameter is found from a small particle diameter side of particle diameter distribution in the case where an overall particle diameter distribution of the boron nitride flake 12 is 100%—when a cumulative value thereof is 50%. Particle size distribution (particle diameter distribution) is found by a volume basis. An example of a method for measuring particle size distribution includes a method using a laser diffraction particle size distribution analyzer.

An aspect ratio of the boron nitride flake 12 is not particularly limited and may be selected as appropriate according to the purpose. For example, the aspect ratio of the boron nitride flake 12 may be in a range of 10 to 100. An average value of the ratio of the major axis to the minor axis (major axis/minor axis) of the boron nitride flake 12 may be, for example, in a range of 0.5 to 10, may be in a range of 1 to 5, or may be in a range of 1 to 3.

From the viewpoint of thermal conductivity of the heat transfer sheet 3, a content of the boron nitride flake 12 in the thermally conductive resin composition may be, for example, 18 mass % or more, may be 20 mass % or more, may be 22 mass % or more, may be 24 mass % or more, may be 26 mass % or more, or may be 28 mass % or more. Furthermore, from the viewpoint of suppressing the viscosity of the heat transfer sheet 3 from becoming too high, a content of the boron nitride flake 12 in the thermally conductive resin composition may be, for example, 35 mass % or less, may be 33 mass % or less, may be 30 mass % or less, or may be 29 mass % or less. One type of the boron nitride flake 12 may be used alone or two or more types may be used in combination. When two or more types of the boron nitride flake 12 are used in combination, it is preferable that the content thereof meets the aforementioned content.

<Inorganic filler>

The inorganic filler 11 is an inorganic filler (heat transfer filler) other than the carbon fiber 10 or the boron nitride flake 12. The inorganic filler 11 preferably includes at least one of aluminum oxide, aluminum nitride, and aluminum hydroxide, for example. A form that includes aluminum oxide or a form wherein aluminum oxide and aluminum nitride are used in combination is preferred as a specific example.

A specific surface area of the inorganic filler 11 may be selected as appropriate according to the purpose; for example, from the viewpoint of making the surface condition of the heat transfer sheet smoother after undergoing pressing, it may be 1.4 m$^2$/g or more, or may be in a range of 1.4 to 3.3 m$^2$/g. The specific surface area of the inorganic filler 11 may be measured, for example, by a BET method.

A shape or a volume average particle diameter of the inorganic filler 11 may be set as appropriate according to the purpose. Examples of the shape of the inorganic filler 11 include spherical, ellipsoidal, block-shaped, granular, flat, needle-shaped, and the like. Among these, spherical and ellipsoidal shapes are preferred from the viewpoint of fillability, and spherical is even more preferred.

From the viewpoint of more effectively developing the tackiness of the heat transfer sheet 3, the volume average particle diameter of the inorganic filler 11 may be 0.1 μm or more, may be 0.5 μm or more, may be 1.0 μm or more, may be 2.0 μm or more, may be 3.0 μm or more, or may be 4.0 μm or more. Furthermore, an average particle diameter of the inorganic filler may be 8.0 μm or less, may be 7.0 μm or less, may be 6.0 μm or less, may be in a range of 3.0 to 7.0 μm, may be in a range of 4.0 to 6.0 μm, may be in a range of 0.5 to 2.0 μm, or may be in a range of 1.0 to 5.0 μm. The volume average particle diameter of the inorganic filler 11 refers to a particle size—when a cumulative curve of the value of the particle diameter is found from a small particle diameter side of particle diameter distribution in the case where an overall particle diameter distribution of the inorganic filler 11 is 100%—when a cumulative value thereof is 50%. An example of a method for measuring particle size distribution includes a method using a laser diffraction particle size distribution analyzer.

The inorganic filler 11 may undergo surface treatment. Examples of surface treatment include treating the inorganic filler 11 using a coupling agent, such as an alkoxysilane compound. The amount of coupling agent used for treatment may be in a range of 0.1 to 1.5 mass % of the total amount of inorganic filler, for example.

An alkoxysilane compound is a compound having a structure wherein one to three bonds from among four bonds having a silicon atom (Si) are bound to an alkoxy group and the remaining bond or bonds are bound to an organic substituent. Examples of the alkoxy group of the alkoxysilane compound include a methoxy group, an ethoxy group, a butoxy group, or the like. Specific examples of the alkoxysilane compound include a trimethoxysilane compound, a triethoxysilane compound, or the like.

From the viewpoint of more effectively suppressing an increase in thermal resistance of the heat transfer sheet 3, a content of the inorganic filler 11 in the thermally conductive resin composition may be, for example, 40 mass % or more, may be 45 mass % or more, may be 50 mass % or more, may be 55 mass % or more, may be 60 mass % or more, or may be 65 mass % or more. Furthermore, from the viewpoint of further improving flexibility of the heat transfer sheet 3, the content of the inorganic filler 11 in the thermally conductive resin composition may be, for example, 80 mass % or less, may be 75 mass % or less, may be 70 mass % or less, or may be 65 mass % or less. One type of the inorganic filler 11 may be used alone or two or more types may be used in combination. When two or more types of the inorganic filler 11 are used in combination, it is preferable that the content thereof meets the aforementioned content.

<Binder resin>

The binder resin 9 is not particularly limited and may be selected as appropriate according to the purpose; examples include a thermoplastic resin, a thermoplastic elastomer, a thermosetting polymer, or the like.

Examples of the thermoplastic resin include a polyethylene, a polypropylene, an ethylene-α olefin copolymer such as an ethylene-propylene copolymer or the like, a polymethylpentene, a polyvinyl chloride, a polyvinylidene chloride, a polyvinyl acetate, an ethylene-vinyl acetate copolymer, a polyvinyl alcohol, a polyvinyl acetal, a fluorinated polymer such as a polyvinylidene fluoride, a polytetrafluoroethylene, or the like, a polyethylene terephthalate, a polybutylene terephthalate, a polyethylene naphthalate, a polystyrene, a polyacrylonitrile, a styrene-acrylonitrile copolymer, an acrylonitrile-butadiene-styrene copolymer (ABS) resin, a polyphenylene-ether copolymer (PPE) resin, a modified PPE resin, an aliphatic polyamide, an aromatic polyamide, a polyimide, a polyamide-imide, a polymethacrylic acid, a polymethacrylate ester such as polymethacrylic acid methyl ester or the like, a polyacrylic acid, a polycarbonate, a polyphenylene sulfide, a polysulfone, a polyether sulfone, a polyether nitrile, a polyether ketone, a polyketone, a liquid crystal polymer, a silicone resin, an ionomer, or the like.

Examples of the thermoplastic elastomer include a styrene-butadiene block copolymer or a hydrogenated product thereof, a styrene-isoprene block copolymer or a hydrogenated product thereof, a styrene-based thermoplastic elastomer, an olefin-based thermoplastic elastomer, a vinyl chloride-based thermoplastic elastomer, a polyester-based thermoplastic elastomer, a polyurethane-based thermoplastic elastomer, a polyamide-based thermoplastic elastomer, or the like.

Examples of the thermosetting resin include a cross-linked rubber, an epoxy resin, a phenolic resin, a polyimide resin, an unsaturated polyester resin, a diallyl phthalate resin, or the like. Specific examples of the cross-linked rubber include a natural rubber, an acrylic rubber, a butadiene rubber, an isoprene rubber, a styrene-butadiene copolymer rubber, a nitrile rubber, a hydrogenated nitrile rubber, a chloroprene rubber, an ethylene-propylene copolymer rubber, a chlorinated polyethylene rubber, a chlorosulfonated polyethylene rubber, a butyl rubber, a halogenated butyl rubber, a fluoro rubber, a urethane rubber, a silicone rubber, or the like.

A silicone resin is preferred as the binder resin 9, for example, from the viewpoint of moldability, weather resistance, and adhesion or followability between a heat-generating face of an electronic component and a heat sink face. A two-component addition-reaction silicone resin may be used as the silicon resin, composed of, for example, a main agent containing a silicone having an alkenyl group as a main component and a curing catalyst, and a curing agent having a hydrosilyl group (Si—H group). A polyorganosiloxane having a vinyl group may be used, for example, as the silicone having an alkenyl group. The curing catalyst is a catalyst for promoting an addition reaction between the alkenyl group in the silicone having the alkenyl group and the hydrosilyl group in the curing agent having the hydrosilyl group. Examples of the curing catalyst include a well-known catalyst as a catalyst used for a hydrosilylation reaction; for example, a platinum group-based curing catalyst—for example, a single platinum group metal such as platinum, rhodium, palladium, or the like, or platinum chloride—may be used. A polyorganosiloxane having a hydrosilyl group may be used, for example, as the curing agent having the hydrosilyl group.

The content of binder resin 9 in the thermally conductive resin composition is not particularly limited and may be selected as appropriate according to the purpose. For example, the content of binder resin 9 in the thermally conductive resin composition may be 11 mass % or more, or even 14 mass % or more, 20 mass % or more, or 25 mass % or more. Furthermore, the content of the binder resin 9 in the thermally conductive resin composition may be 60 mass % or less, or even 50 mass % or less, 40 mass % or less, 30 mass % or less, 20 mass % or less, or 15 mass % or less. One type of the binder resin 9 may be used alone or two or more types may be used in combination. When two or more types of the binder resin 9 are used in combination, it is preferable that the content thereof meets the aforementioned content.

[Process B1]

In the process B1, the molded body is sliced into a sheet shape to obtain a molded sheet. At least one of the carbon fiber 10 and the boron nitride flake 12 are exposed on the molded sheet obtained by slicing. There are no particular restrictions on the slicing method, which may be selected as appropriate from among known slicing devices according to a size or mechanical strength of the molded block. Examples of slicing devices include an ultrasonic cutter, a plane, or the like.

In terms of a slice direction of the molded block, when the molding method is an extrusion molding method, some of at least one of the carbon fiber 10 and the boron nitride flake 12 are oriented in an extrusion direction; therefore, for the extrusion direction, 60 to 120 degrees is preferred, a direction of 70 to 100 degrees is more preferred, and a direction of 90 degrees (vertical) is even more preferred. When a columnar molded block is formed by the extrusion molding method in the process A1, in the process B1, it is preferable to slice in a direction substantially perpendicular to a length direction of the molded block. An average thickness of the molded sheet may be selected as appropriate according to the purpose; for example, it may be in a range of 0.1 to 5.0 mm or may be in a range of 0.2 to 1.0 mm.

[Process C1]

In the process C1, a sliced face of the molded sheet is pressed. In the process C1, the sliced face of the molded sheet obtained in the process B1 is pressed to obtain a molded sheet after pressing (hereinafter also referred to as "heat transfer sheet precursor"), containing at least one of the carbon fiber 10 and the boron nitride flake 12, the inorganic filler 11, and the binder resin 9, wherein at least one of the carbon fiber 10 and the boron nitride flake 12 are oriented in the thickness direction. A surface of the heat transfer sheet precursor obtained in the process C1 is made smoother, and adhesion may be further improved when it is inserted between films in the process D1 described below.

A pair of press devices composed of a flat plate and a press head having a flat surface may be used to press the molded sheet. Furthermore, the molded sheet may also be pressed by a pinch roll. A pressure during pressing may be, for example, in a range of 0.1 to 100 MPa, or even a range of 0.1 to 1 MPa or a range of 0.1 to 0.5 MPa. A pressing time may be selected as appropriate according to the pressure, sheet area, or the like during pressing; for example, it may be in a range of 10 seconds to five minutes, or even in a range of 30 seconds to three minutes.

In one embodiment, a press head having a built-in heater may be used to perform pressing while heating. A pressing temperature may be in a range of 0 to 180° C., for example, and may even be in a range of room temperature (for example, 25° C.) to 100° C., or a range of 30 to 100° C. To further enhance the effect of pressing and reduce the pressing time, pressing may be performed at a glass transition temperature (Tg) or more of the binder resin 9 constituting the molded sheet.

The pressing process in the process C1 is preferably performed using a spacer for compressing the molded sheet to a predetermined thickness. A thickness of the heat transfer sheet precursor may be selected as appropriate according to the purpose; for example, it may be in a range of 0.1 to 5.0 mm, or may be in a range of 0.2 to 1.0 mm.

Pressing the sliced face of the molded sheet in the process C1 compresses the molded sheet in the thickness direction, which further increases a frequency of contact between at least one of the carbon fiber 10 and the boron nitride flake 12 and the inorganic filler 11, thereby reducing a thermal resistance value of the heat transfer sheet precursor. The thermal resistance value of the heat transfer sheet precursor may be, at a load of 1 kgf/cm$^2$, for example, 0.633° C.·cm$^2$/W or less, may be 0.585° C.·cm$^2$/W or less, may be 0.350° C.·cm$^2$/W or less, may be 0.340° C.·cm$^2$/W or less, may be 0.330° C.·cm$^2$/W or less, may be 0.320° C.·cm$^2$/W or less, may be 0.310° C.·cm$^2$/W or less, may be 0.305° C.·cm$^2$/W or less, may be in a range of 0.307 to 0.633° C.·cm$^2$/W or less, may be in a range of 0.307 to 0.327° C.·cm$^2$/W or less, or may be in a range of 0.585 to 0.633° C.·cm$^2$/W or less. The thermal resistance of the heat transfer sheet precursor may be measured by a method described in an example below.

In the process C1, the molded sheet is in a state wherein it is interposed by films (for example, release films)—that is, a laminated body of a film, the molded sheet, and a film may be pressed. This may prevent the molded sheet from sticking to the press device when pressing the molded sheet. The film may be peeled off after the molded sheet is pressed.

[Process D1]

Figure 3:
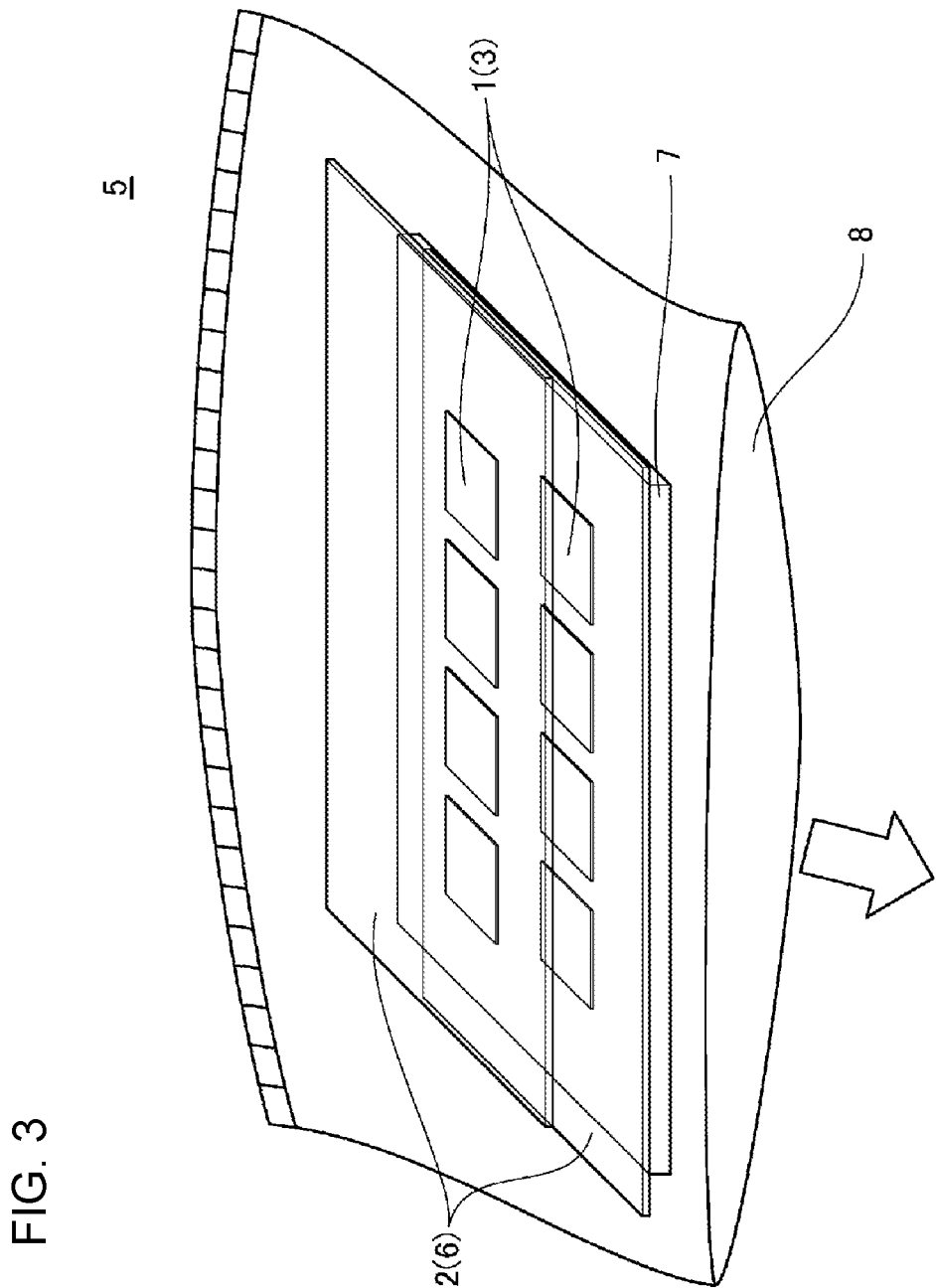
FIG. 3 is a perspective view for describing one example of inserting a pressed molded sheet between films and vacuum packing it.
Figure 4:
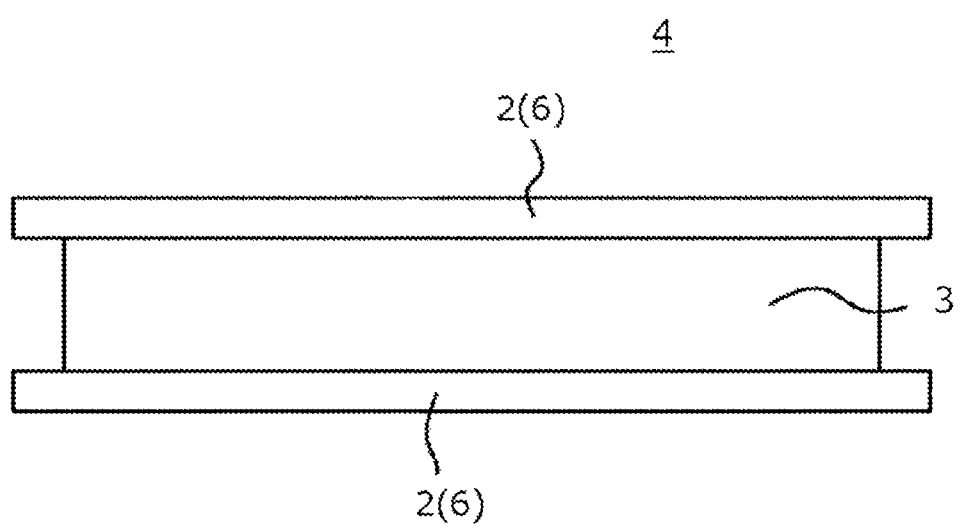
FIG. 4 is a cross-sectional view illustrating one example of a laminated body wherein the heat transfer sheet is interposed between films.

FIG. 3 is a perspective view for describing one example of inserting the pressed molded sheet between the films and vacuum packing it. The arrows in FIG. 3 indicate a direction of vacuum degassing. FIG. 4 is a cross-sectional view illustrating one example of the laminated body wherein the heat transfer sheet is interposed between the films. In the process D1, a heat transfer sheet precursor 1 is inserted between the films 2 and is vacuum packed to cause an uncured component of the binder resin 9 present inside the heat transfer sheet precursor 1 to exude to a surface of the heat transfer sheet precursor 1. The uncured component of the binder resin 9 that seeps to the surface of the heat transfer sheet precursor 1 may be in an uncured state, or may be in a state where curing of the binder resin 9 has proceeded by about several percent.

In the present production method, in addition to imparting tackiness by exudation of the uncured component (residual component) of the binder resin 9 in the molded sheet by pressing in the process C1, in the process D1, the heat transfer sheet precursor 1 is inserted between the films 2 and is vacuum packed, causing the uncured component (residual component) of the binder resin 9 to be exuded further. The heat transfer sheet 3, having tackiness on both faces, is thereby obtained in the present production method.

Examples of the film 2 include a PET (polyethylene terephthalate), a PEN (polyethylene naphthalate), a polyolefin, a polymethylpentene, a glassine paper, or the like. A thickness of the film 2 is not particularly limited and may be selected as appropriate according to the purpose; for example, it may be 0.01 to 0.15 mm. Furthermore, the thinner the thickness of the film 2, the better adherence (followability) to the heat transfer sheet 3, and the tack force of the heat transfer sheet 3 may develop more effectively. For example, from the viewpoint of more effectively developing the tack force of the heat transfer sheet 3, a PET film having a thin thickness is preferred for the film 2.

It is preferable that the tack force of the heat transfer sheet 3 obtained in process D1—that is, that of the heat transfer sheet 3 removed from the vacuum-packed state—satisfies condition 1 below.

Condition 1: The tack force of the heat transfer sheet 3 surface is 100 gf or more when a probe having a diameter of 5.1 mm presses in the heat transfer sheet 3 at a force of 200 gf at 2 mm/sec and pulls it off at 10 mm/sec.

The heat transfer sheet 3 has a tack force of 100 gf or more, as indicated by the aforementioned condition 1, and this may be 105 gf or more, 115 gf or more, 140 gf or more, 150 gf or more, 170 gf or more, 190 gf or more, in a range of 108 to 152 gf, in a range of 108 to 201 gf, or in a range of 176 to 201 gf.

A thermal resistance value of the heat transfer sheet 3 (the heat transfer sheet 3 removed from the vacuum-packed state) may be within ±5% of the thermal resistance value of the heat transfer sheet precursor 1 (the pressed molded sheet before vacuum packing), may be within ±5.0%, may be within ±4.7%, may be within ±4.1%, may be within ±3.1%, may be within ±2.2%, may be within ±1.0%, may be within ±0.5%, or may be within ±0.3%. Thus, the present production method may reduce a change in the thermal resistance value of the heat transfer sheet 3 before and after vacuum packing.

In the process D1, for example, it is preferable to insert the heat transfer sheet precursor 1 between the films 2 and hold it for a predetermined time or more in a predetermined reduced pressure state.

From the viewpoint of requiring the development of tack force, the predetermined reduced pressure state is preferably less than 400 torr, or even 350 torr or less, or 300 torr or less. Furthermore, a lower limit of the predetermined reduced pressure state is not particularly limited, but may be, for example, 150 torr or more, or even 200 torr or more, 250 torr or more, or 300 torr or more. A preferred range for the predetermined reduced pressure state is, for example, 150 to 300 torr.

Furthermore, a holding time of the predetermined reduced pressure state may be, for example, one minute or more, or even 10 minutes or more, 30 minutes or more, one hour or more, two hours or more, three hours or more, six hours or more, eight hours or more, 12 hours or more, 24 hours or more, 120 hours or more, 240 hours or more, or one minute or more and 240 hours or less.

In one embodiment of the process D1, it is preferable to insert the heat transfer sheet precursor 1 between the films 2 and hold it for one minute or more in a reduced pressure state of 150 to 300 torr.

Thus, the heat transfer sheet 3, imparted with strong tack force on the surface, is obtained in the present production method. This kind of heat transfer sheet 3 may have improved adhesion to an adherend such as a heating element, heat dissipating element, or the like, and may be more securely fixed to the adherend. Furthermore, the heat transfer sheet 3 is imparted with a tack force, without worsening the thermal resistance value, such that it does not fall off even when attached to the adherend and inverted. Note that a method using a vacuum press is also conceivable as the method for imparting tackiness to the heat transfer sheet 3; however, productivity tends to be poor because of the takt time required for creating a vacuum and returning to the atmosphere. On the other hand, according to the present production method, strong tackiness may be imparted without compromising a thermal performance of the heat transfer sheet 3, while also reducing the labor and cost of the production process compared to the method using a vacuum press.

<Heat transfer sheet>

As illustrated in FIG. 1, one embodiment of the heat transfer sheet 3 contains the binder resin 9, at least one of the carbon fiber 10 and the boron nitride flake 12, and the inorganic filler 11. Furthermore, in the heat transfer sheet 3, at least one of the carbon fiber 10 and the boron nitride flake 12 are oriented in a thickness direction B of the heat transfer sheet 3. The heat transfer sheet 3 has good tackiness as described above, which improves handling during use and adhesion to the adherend. The binder resin 9, the carbon fiber 10, the inorganic filler 11, and the boron nitride flake 12 are synonymous with the binder resin 9, the carbon fiber 10, the inorganic filler 11, and the boron nitride flake 12 described in the section on the aforementioned method for producing the heat transfer sheet, and the preferred ranges are also the same.

Also, it is preferable that the heat transfer sheet 3 satisfies the aforementioned condition 1 in terms of tack force when removed from the sealed state obtained by holding the reduced pressure state of 150 to 300 torr for one minute or more. The sealed state is a tightly sealed state such that the heat transfer sheet 3 may be held at a reduced pressure state of 150 to 300 torr for one minute or more.

The thermal resistance value of the heat transfer sheet 3 after removal from the aforementioned sealed state may be within ±5% of the thermal resistance value of the heat transfer sheet before sealing, may be within ±4.1%, may be within ±3.1%, may be within ±2.2%, may be within ±1%, may be within ±0.5%, or may be within ±0.3%.

A thickness of the heat transfer sheet 3 is not particularly limited and may be selected as appropriate according to the purpose. For example, the thickness of the heat transfer sheet 3 may be 0.05 mm or more, or may be 0.1 mm or more. Furthermore, an upper limit of the thickness of the heat transfer sheet 3 may be 5 mm or less, or even 4 mm or less or 3 mm or less. It is preferable that the heat transfer sheet 3 has a thickness of 0.1 to 4 mm from the viewpoint of ease of handling. The thickness of the heat transfer sheet 3 may be found, for example, from an arithmetic average value of the thickness of the heat transfer sheet 3 measured at any five locations.

<Method for producing a heat transfer sheet package>

A method for producing the heat transfer sheet package according to the present art includes a process A2 of forming a mixture containing at least one of the carbon fiber 10 and the boron nitride flake 12, the inorganic filler 11, and the binder resin 9 into the molded body, and orienting at least one of the carbon fiber 10 and the boron nitride flake 12 in the thickness direction of the molded body; a process B2 of slicing the molded body into a sheet shape to obtain the molded sheet; a process C2 of pressing a sliced face of the molded sheet; and a process D2 of inserting the pressed molded sheet between thermoplastic resin films and vacuum packing it.

Since the process A2 is the same as the process A1 of the aforementioned method for producing the heat transfer sheet, a detailed description is omitted.

Since the process B2 is the same as the process B1 of the aforementioned method for producing the heat transfer sheet, a detailed description is omitted.

Since the process C2 is the same as the process C1 of the aforementioned method for producing the heat transfer sheet, a detailed description is omitted.

In the process D2, as illustrated in FIG. 3, the heat transfer sheet package 5 is obtained by inserting the heat transfer sheet precursor 1 between thermoplastic resin films 6 and vacuum packing it. In the process D2, the mechanism by which an oil component (for example, the uncured component of the binder resin of the heat transfer sheet 3) present inside the heat transfer sheet 3 bleeds to an interface with the thermoplastic resin film 6 is promoted by a vacuum state, and the tackiness of the heat transfer sheet 3 may be developed further. Therefore, the heat transfer sheet 3 constituting the heat transfer sheet package 5 obtained in the process D2 has improved ease of handling during use and improved adhesion to an adherend.

In one embodiment of the process D2, the heat transfer sheet package 5 is obtained by sealing the laminated body 4 in which the heat transfer sheet 3 is interposed between the thermoplastic resin films 6 in a reduced pressure state inside a sealing film 8.

In the process D2, in the same manner as the aforementioned process D1, it is preferable to insert the heat transfer sheet precursor 1 between the thermoplastic resin films 6 and hold it for a predetermined time or more in a predetermined reduced pressure state. This allows, for example, the tackiness of the heat transfer sheet 3 to be improved when the heat transfer sheet package 5 has the heat transfer sheet 3 vacuumed packed therein as a product, and also allows good thermal conductivity of the heat transfer sheet 3 to be maintained. Accordingly, when selling the heat transfer sheet 3 to a user, for example, the heat transfer sheet 3 may be supplied while maintaining the performance (for example, thermal conductivity) of the heat transfer sheet 3 when it is designed.

It is preferable that the tack force of the heat transfer sheet 3—that is, the tack force of the heat transfer sheet 3 removed from the heat transfer sheet package 5—satisfies the aforementioned condition 1. A preferred range of the tack force of the heat transfer sheet 3 is the same as the tack force of the heat transfer sheet 3 in the aforementioned process D1.

Even after the heat transfer sheet precursor 1 is inserted between the thermoplastic resin film 6, vacuum packed, and held for a predetermined time—for example, 240 hours or less—the thermally conductive sheet 3 constituting the heat transfer sheet package 5 may exhibit good performance (for example, high tack force or thermal conductivity).

Examples of a material of the thermoplastic resin film 6 include a PET (polyethylene terephthalate), a polyolefin, a polymethylpentene, or the like. A thickness of the thermoplastic resin film 6 is not particularly limited and may be selected as appropriate according to the purpose; for example, it may be 0.01 to 0.15 mm. Furthermore, the thinner the thickness of the thermoplastic resin film 6, the better the followability (adhesion) to the heat transfer sheet 3, and the tack force of the heat transfer sheet 3 may be developed more effectively. For example, from the viewpoint of more effectively developing the tack force of the heat transfer sheet 3, a PET film having a thin thickness is preferred for the thermoplastic resin film 6.

A substrate 7 is not particularly limited in material or thickness, provided that the laminated body 4 may be placed thereon; for example, a thick paper may be used.

The sealing film 8 is not particularly limited, provided that it is capable of vacuum packing the laminated body 4 for a predetermined time or more; for example, a bag composed of a thermoplastic material may be used.

<Heat transfer sheet package>

The heat transfer sheet package 5 according to the present art, as illustrated in FIG. 3, contains the heat transfer sheet 3 and holds the heat transfer sheet 3 in a vacuum state. The heat transfer sheet 3 contained in the heat transfer sheet package 5 has good tackiness as described above, which improves handling during use and adhesion to the adherend.

In one embodiment of the heat transfer sheet package 5, as illustrated in FIGS. 3 and 4, an example of the heat transfer sheet package 5, obtained by sealing the laminated body 4—wherein the heat transfer sheet 3 is interposed between the thermoplastic resin films 6—in a vacuum state (preferably a reduced pressure state of 150 to 300 torr) inside the sealing film 8. The number of heat transfer sheets 3 contained in the heat transfer sheet package 5 may be one, or may be two or more. When the heat transfer sheet package 5 has two or more heat transfer sheets 3, each heat transfer sheet 3 may be disposed at a predetermined interval, as illustrated in FIG. 3.

<Electronic device>

The heat transfer sheet 3 may be placed between a heating element and a heat dissipating element, for example, to create an electronic device (thermal device) having a structure arranged between these elements to release heat generated by the heating element to the heat dissipating element. The electronic device has at least the heating element, the heat dissipating element, and the heat transfer sheet 3, and may further have other components as needed.

The heating element is not particularly limited, and examples include an integrated circuit element such as a CPU (Central Processing Unit), a GPU (Graphics Processing Unit), a DRAM (Dynamic Random Access Memory), a flash memory, or the like, or an electronic component for generating heat in an electric circuit such as a transistor, resistor, or the like. Furthermore, the heating element also includes a component for receiving optical signals, such as an optical transceiver in a telecommunications device.

The heat dissipating element is not particularly limited, and examples include a heat sink or a heat spreader, which is used with an integrated circuit element, a transistor, an optical transceiver housing, or the like. Examples of the material for the heat sink or the heat spreader include copper, aluminum, or the like. In addition to a heat spreader or heat sink, the heat dissipating element may be any element that conducts and dissipates heat generated from a heat source to the outside, and examples include a radiator, a cooler, a die pad, a printed circuit board, a cooling fan, a Peltier element, a heat pipe, a vapor chamber, a metal cover, a housing, or the like. A heat pipe has a hollow structure having a cylindrical shape, a substantially cylindrical shape, or a flat cylindrical shape, for example.

Figure 5:
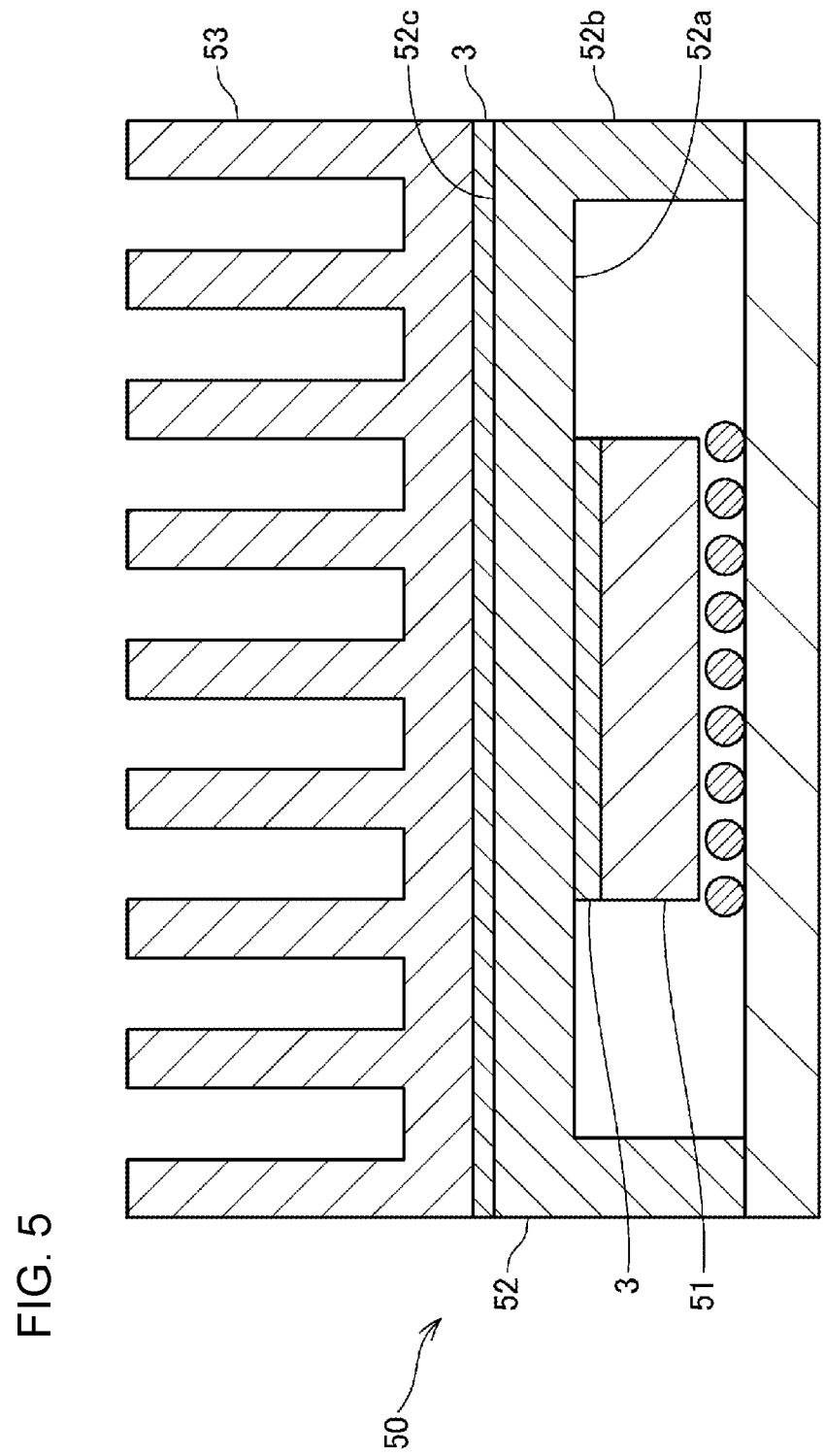
FIG. 5 is a cross-sectional view illustrating one example of a semiconductor device to which the heat transfer sheet is applied.

FIG. 5 is a cross-sectional view illustrating one example of a semiconductor device to which the heat transfer sheet is applied. For example, as illustrated in FIG. 5, the heat transfer sheet 3 is mounted on a semiconductor device 50 built-in various electronic devices and interposed between the heating element and the heat dissipating element. The semiconductor device 50 illustrated in FIG. 5 is provided with an electronic component 51, a heat spreader 52, and the heat transfer sheet 3, wherein the heat transfer sheet 3 is interposed between the heat spreader 52 and the electronic component 51. The heat transfer sheet 3 is interposed between the heat spreader 52 and a heat sink 53, and together with the heat spreader 52, thereby constitutes a heat-dissipating member for dissipating heat from the electronic component 51. A mounting location of the heat transfer sheet 3 is not limited to between the heat spreader 52 and the electronic component 51 or between the heat spreader 52 and the heat sink 53; it may be selected as appropriate according to a configuration of the electronic device or the semiconductor device. The heat spreader 52 has, for example, a main face 52a formed as a square plate and facing the electronic component 51, and a side wall 52b erected along a periphery of the main face main face 52a. The heat spreader 52 is provided with a heat transfer sheet 3 on the main face 52a surrounded by the side wall 52b, and the heat sink 53 is provided through the heat transfer sheet 3 on an other face 52c on an opposite side to the main face 52a.

EXAMPLES

Examples of the present art are described below. The present art is not limited to these examples.

Example 1

In Example 1, a silicon resin composition (thermally conductive resin composition) was prepared by dispersing 67 mass % aluminum oxide particles having a volume average particle diameter of 5 μm (manufactured by Denki Kagaku Kogyo) which was coupled by a 0.1 mass % coupling agent and 22 mass % pitch-based carbon fibers (average fiber length of 150 μm, average fiber diameter of 91 μm, manufactured by Nippon Graphite Fiber), in a 10.9 mass % two-component addition-reaction liquid silicone resin. Note that the two-component addition-reaction liquid silicone resin is a mixture of a silicone liquid A and a silicone liquid B at a ratio of 6.5 mass % and 4.4 mass %, respectively.

Next, a silicone mold was molded by extruding the resulting silicone resin composition into a cuboidal mold (50 mm×50 mm) having release-treated polyethylene terephthalate (PET) film applied to its inner walls.

A silicone cured product was created by curing the resulting silicone mold in an oven at 100° C. for six hours. A molded sheet having a thickness of 0.53 mm was obtained by cutting the resulting silicone cured product with an ultrasonic cutter. The slicing speed of the ultrasonic cutter was set to 50 mm per second. Furthermore, ultrasonic vibration imparted to the ultrasonic cutter was set at an oscillation frequency of 20.5 kHz and an amplitude of 60 μm.

A 0.50 mm thick heat transfer sheet having carbon fibers oriented in the thickness direction was obtained by inserting the resulting molded sheet between release-treated PET films and then subjecting it to pressing by applying a 0.5 mm thick spacer. The pressing conditions were 87° C. and 0.5 MPa for 180 seconds.

The heat transfer sheet obtained by pressing was again interposed between release-treated PET films and placed in a polyethylene bag, and then the polyethylene bag was sealed by reducing the pressure from normal (760 torr) to 200 torr using a degassing sealer (manufactured by Fuji Impulse). A heat transfer sheet package containing the heat transfer sheet and holding the heat transfer sheet in a vacuum state was thereby obtained. Also, in Example 1, the inside of the polyethylene bag constituting the heat transfer sheet package was returned to normal pressure one minute after sealing the polyethylene bag.

Example 2

Example 2 was conducted in the same manner as Example 1, except that the inside of the polyethylene bag constituting the heat transfer sheet package was returned to normal pressure 12 hours after sealing the polyethylene bag.

Example 3

Example 3 was conducted in the same manner as Example 1, except that the inside of the polyethylene bag constituting the heat transfer sheet package was returned to normal pressure 24 hours after sealing the polyethylene bag.

Example 4

Example 4 was conducted in the same manner as Example 1, except that the inside of the polyethylene bag constituting the heat transfer sheet package was returned to normal pressure 120 hours after sealing the polyethylene bag.

Example 5

Example 5 was conducted in the same manner as Example 1, except that the inside of the polyethylene bag constituting the heat transfer sheet package was returned to normal pressure 240 hours after sealing the polyethylene bag.

Example 6

Example 6 was conducted in the same manner as Example 2, except that the heat transfer sheet obtained by pressing was again interposed between release-treated PET film and placed in a polyethylene bag, and then the polyethylene bag was sealed by reducing the pressure from normal (760 torr) to 150 torr using a degassing sealer.

Example 7

Example 7 was conducted in the same manner as Example 2, except that the heat transfer sheet obtained by pressing was again interposed between release-treated PET film and placed in a polyethylene bag, and then the polyethylene bag was sealed by reducing the pressure from normal (760 torr) to 300 torr using a degassing sealer.

Example 8

In Example 8, a silicon resin composition (thermally conductive resin composition) was prepared by dispersing 32 mass % aluminum oxide particles having a volume average particle diameter of 11 μm coupled by a 0.1 mass % coupling agent, 28 mass % aluminum nitride particles having a volume average particle diameter of 11 μm, and 25 mass % boron nitride flake having a volume average particle diameter of 40 μm, in a 14.9 mass % two-component addition-reaction liquid silicone resin. Note that the two-component addition-reaction liquid silicone resin is a mixture of silicone liquid A and silicone liquid B at a ratio of 8.2 mass % and 6.7 mass %, respectively.

Next, a silicone mold was molded by extruding the resulting silicone resin composition into a cuboidal mold (50 mm×50 mm) having release-treated polyethylene terephthalate (PET) film applied to its inner walls.

A silicone cured product was created by curing the resulting silicone mold in an oven at 100° C. for six hours. A molded sheet having a thickness of 0.53 mm was obtained by cutting the resulting silicone cured product with an ultrasonic cutter. The slicing speed of the ultrasonic cutter was set to 50 mm per second. Furthermore, ultrasonic vibration imparted to the ultrasonic cutter was set at an oscillation frequency of 20.5 kHz and an amplitude of 60 μm.

A 0.50 mm thick heat transfer sheet having carbon fibers oriented in the thickness direction was obtained by inserting the resulting molded sheet between release-treated PET films and then subjecting it to pressing by applying a 0.5 mm thick spacer. The pressing conditions were 87° C. and 0.5 MPa for 180 seconds.

The heat transfer sheet obtained by pressing was again interposed between release-treated PET films and placed in a polyethylene bag, and then the polyethylene bag was sealed by reducing the pressure from normal (760 torr) to 200 torr using a degassing sealer (manufactured by Fuji Impulse). A heat transfer sheet package containing the heat transfer sheet and holding the heat transfer sheet in a vacuum state was thereby obtained. Also, in Example 8, the inside of the polyethylene bag constituting the heat transfer sheet package was returned to normal pressure 24 hours after sealing the polyethylene bag.

Example 9

Example 9 was conducted in the same manner as Example 8, except that the inside of the polyethylene bag constituting the heat transfer sheet package was returned to normal pressure 240 hours after sealing the polyethylene bag.

Comparative Example 1

In Comparative Example 1, the heat transfer sheet obtained by pressing using the same method as in Example 1 was used as is.

Comparative Example 2

In Comparative Example 2, the heat transfer sheet obtained by pressing using the same method as in Example 1 was interposed between release-treated PET films again, and then a load of 0.0176 kgf/cm² was applied and left for 48 hours.

Comparative Example 3

Comparative Example 3 was conducted in the same manner as Example 2, except that the heat transfer sheet obtained by pressing was again interposed between release-treated PET films and placed in a polyethylene bag, and then the polyethylene bag was sealed by reducing the pressure from normal (760 torr) to 400 torr using a degassing sealer.

Comparative Example 4

In Comparative Example 4, the heat transfer sheet obtained by pressing using the same method as in Example 8 was used as is.

<Tack force>

In Examples 1 to 9 and Comparative Example 3, the inside of the polyethylene bag constituting the heat transfer sheet package was returned to normal pressure, and the tack force of the heat transfer sheet was measured. In Comparative Examples 1 and 4, the tack force of the heat transfer sheets obtained by pressing was measured. In Comparative Example 2, the heat transfer sheet obtained by pressing was interposed between release-treated PET films again, a load of 0.0176 kgf/cm² was applied and left for 48 hours, and then the tack force was measured. Specifically, the tack force (gf) of the heat transfer sheet surface was found when a probe having a diameter of 5.1 mm pressed in the heat transfer sheet at a force of 200 gf at 2 mm/sec and pulled it off at 10 mm/sec. The tack force was measured in DEPTH mode using a tackiness tester (manufactured by Malcom). The results are shown in Table 1.

<Heat resistance>

In Examples 1 to 9 and Comparative Example 3, the thermal resistance (° C.·cm²/W) of the heat transfer sheet before heat sealing, wherein the external form was processed to 20 mm in diameter, was measured at a load of 1 kgf/cm² by a method according to ASTM-D5470. The results are shown in Table 1. Note that the thermal resistance of the heat transfer sheet was found according to the following formula.

$\Delta T = T_H - T_c$ ($T_H$: surface temperature [° C.] of the high temperature side of the heat transfer sheet; $T_c$: surface temperature [° C.] of the low temperature side of the heat transfer sheet)

$R = \Delta T / Q \times A$ (R: thermal resistance (thermal impedance) [° C.·cm²/W]; Q: heat flux [W]; A: measured sample area [cm²])

<Rate of change of thermal resistance>

In Examples 1 to 9 and Comparative Example 3, the thermal resistance (° C.·cm²/W) of the heat transfer sheet after the inside of the polyethylene bag constituting the heat transfer sheet package was returned to normal pressure, wherein the external form was processed to 20 mm in diameter, was measured at a load of 1 kgf/cm² by a method according to ASTM-D5470. Then, the rate of change (%) of the thermal resistance of the heat transfer sheet after heat sealing was found based on the thermal resistance of the heat transfer sheet before heat sealing. The results are shown in Table 1.

Furthermore, in Comparative Example 2, after the heat transfer sheet obtained by pressing was interposed between release-treated PET films again, the thermal resistance (° C.·cm²/W) of the heat transfer sheet after a load of 0.0176 kgf/cm² was applied and left for 48 hours was measured in the same manner as Examples 1 to 9 and Comparative Example 3. Also, the rate of change (%) of the thermal resistance of the heat transfer sheet after a load was applied was then found based on the thermal resistance of the heat transfer sheet before a load of 0.0176 kgf/cm² was applied. The results are shown in Table 1.

TABLE 1

| | Ex. 1 | Ex. 2 | Ex. 3 | Ex. 4 | Ex. 5 | Ex. 6 | Ex. 7 | Ex. 8 | Ex. 9 | Comp. Ex. 1 | Comp. Ex. 2 | Comp. Ex. 3 | Comp. Ex. 4 |
|---|---|---|---|---|---|---|---|---|---|---|---|---|---|
| Sheet thickness [mm] | 0.5 | 0.5 | 0.5 | 0.5 | 0.5 | 0.5 | 0.5 | 0.5 | 0.5 | 0.5 | 0.5 | 0.5 | 0.5 |
| Sealing pressure [torr] | 200 | 200 | 200 | 200 | 200 | 150 | 300 | 200 | 200 | — | — | 400 | — |
| Reduced pressure sealing time [hrs] | 1/60 | 12 | 24 | 120 | 240 | 12 | 12 | 24 | 240 | — | — | 12 | — |
| Tack force [gf] | 116 | 154 | 152 | 148 | 152 | 138 | 108 | 176 | 201 | 56 | 57 | 52 | 99 |
| Thermal resistance [° C · cm²/W] | 0.307 | 0.315 | 0.313 | 0.313 | 0.315 | 0.327 | 0.320 | 0.633 | 0.585 | 0.314 | 0.296 | 0.317 | 0.614 |
| Rate of change of thermal resistance [%] | −2.2 | 0.3 | −0.3 | −0.3 | 0.3 | 4.1 | 1.9 | 3.1 | −4.7 | — | −5.7 | 1.0 | — |

Ex. = Example, Comp. Ex. = Comparative Example

In Examples 1 to 9, it was found that a heat transfer sheet is obtained containing silicon resin, at least one of the carbon fiber and the boron nitride flake, and the inorganic filler, and at least one of the carbon fiber and the boron nitride flake are oriented in the thickness direction B, wherein the tack force satisfies the aforementioned condition 1 when removed from a sealed state created by holding a reduced pressure state of 150 to 300 torr for one minute or more. Thus, it was found that the heat transfer sheets obtained in Examples 1 to 9 were imparted with strong tack force on the surface.

Furthermore, it was found that the heat transfer sheets obtained in Examples 1 to 9 had improved tack force, and changes in thermal resistance were able to be suppressed. Specifically, it was found that the thermal resistance values of the heat transfer sheets obtained in Examples 1 to 9 after removal from the sealed state were within ±5% of the thermal resistance before sealing. Furthermore, it was found that the thermal resistance values of the heat transfer sheets obtained in Examples 2 to 5 and 7 after removal from the sealed state were within ±2% of the thermal resistance before sealing. Moreover, it was found that the thermal resistance values of the heat transfer sheets obtained in Examples 2 to 4 after removal from the sealed state were within ±1% of the thermal resistance before sealing.

It was found that heat transfer sheets having a tack force satisfying the aforementioned condition 1 could not be obtained in Comparative Examples 1 to 4. In Comparative Examples 1, 2, and 4, this is believed to be due to the fact that the pressed molded sheets were not inserted between release-treated PET film and vacuum packed. In Comparative Example 3, this is believed to be due to the fact that there was insufficient pressure reduction during vacuum packing of the heat transfer sheet obtained by pressing.

REFERENCE SIGNS LIST

1 Pressed molded sheet (heat transfer sheet precursor), 2 film, 3 heat transfer sheet, 4 laminated body, 5 heat transfer sheet package, 6 thermoplastic resin film, 7 substrate, 8 sealing film, 9 binder resin, 10 carbon fiber, 11 inorganic filler, 12 boron nitride flake, 50 semiconductor device, 51 electronic component, 52 heat spreader, 52a main face, 52b side wall, 52c other face, 53 heat sink

The invention claimed is:

1. A method for producing a heat transfer sheet, the method comprising:
   (A1) forming a mixture comprising at least one of a carbon fiber and a boron nitride flake, an inorganic filler, and a binder resin into a molded body in which the at least one of the carbon fiber and the boron nitride flake is oriented in a thickness direction of the molded body;
   (B1) slicing the molded body into a sheet shape to obtain a molded sheet;
   (C1) pressing the molded sheet; and
   (D1), after the pressing, inserting the molded sheet between films and performing a vacuum packing of the molded sheet with the films such that the molded sheet is under a vacuum-packed state and an uncured component of the binder resin present inside the molded sheet is exuded to a surface of the molded sheet, which is the heat transfer sheet.

2. The method according to claim 1, wherein the vacuum packing is performed by holding the molded sheet under a reduced pressure of 150 to 300 torr for one minute or more.

3. The method according to claim 1, wherein a tack force of the heat transfer sheet satisfies condition 1,
   condition 1: the tack force of the heat transfer sheet is 100 gf or more when a probe having a diameter of 5.1 mm presses in the heat transfer sheet at a force of 200 gf at 2 mm/sec and pulls it off at 10 mm/sec.

4. The method according to claim 1, wherein a difference between a thermal resistance value of the heat transfer sheet removed from the vacuum-packed state and a thermal resistance value of the molded sheet before vacuum packing is within ±5% of the thermal resistance value of the molded sheet before vacuum packing.

* * * * *